(12) United States Patent
Sugihara et al.

(10) Patent No.: US 9,975,779 B2
(45) Date of Patent: May 22, 2018

(54) SIC FORMED BODY AND METHOD FOR PRODUCING SIC FORMED BODY

(75) Inventors: Takaomi Sugihara, Tokyo (JP); Masaaki Asakura, Tokyo (JP); Takeshi Tokunaga, Tokyo (JP); Tetsuya Sadaki, Tokyo (JP)

(73) Assignee: TOKAI CARBON CO., LTD., Tokyo (JP)

( * ) Notice: Subject to any disclaimer, the term of this patent is extended or adjusted under 35 U.S.C. 154(b) by 343 days.

(21) Appl. No.: 14/418,765

(22) PCT Filed: Sep. 13, 2012

(86) PCT No.: PCT/JP2012/073413
§ 371 (c)(1),
(2), (4) Date: Jan. 30, 2015

(87) PCT Pub. No.: WO2014/020776
PCT Pub. Date: Feb. 6, 2014

(65) Prior Publication Data
US 2015/0151975 A1 Jun. 4, 2015

(30) Foreign Application Priority Data

Aug. 1, 2012 (JP) ................................. 2012-171002

(51) Int. Cl.
| | | |
|---|---|---|
| C04B 35/565 | (2006.01) | |
| C23C 16/01 | (2006.01) | |
| C23C 16/32 | (2006.01) | |
| C01B 31/36 | (2006.01) | |
| C01B 32/956 | (2017.01) | |

(52) U.S. Cl.
CPC ............ *C01B 31/36* (2013.01); *C01B 32/956* (2017.08); *C04B 35/565* (2013.01); *C23C 16/01* (2013.01); *C23C 16/325* (2013.01); C04B 2235/421 (2013.01); C04B 2235/441 (2013.01); C04B 2235/444 (2013.01); C04B 2235/46 (2013.01); C04B 2235/483 (2013.01); C04B 2235/72 (2013.01); C04B 2235/722 (2013.01)

(58) Field of Classification Search
None
See application file for complete search history.

(56) References Cited

U.S. PATENT DOCUMENTS

| | | |
|---|---|---|
| 2002/0037801 A1 | 3/2002 | Sugihara et al. |
| 2005/0123713 A1 | 6/2005 | Forrest et al. |
| 2007/0042153 A1 | 2/2007 | Forrest et al. |
| 2009/0220788 A1* | 9/2009 | Barrett .................... C01B 31/36 428/402 |
| 2010/0006871 A1 | 1/2010 | Imai et al. |
| 2010/0289033 A1 | 11/2010 | Ohtani et al. |
| 2010/0291328 A1* | 11/2010 | Forrest .................. C04B 35/571 428/34.1 |

FOREIGN PATENT DOCUMENTS

| | | |
|---|---|---|
| JP | 11-121311 A | 4/1999 |
| JP | 2001-220237 A | 8/2001 |
| JP | 2002-3275 A | 1/2002 |
| JP | 2002-47066 A | 2/2002 |
| JP | 2002-128566 A | 5/2002 |
| JP | 2005-119925 A | 5/2005 |
| JP | 2006-16662 A | 1/2006 |
| JP | 4419409 B2 | 2/2010 |
| KR | 10-2007-0026342 A | 3/2007 |

OTHER PUBLICATIONS

Larkin; Hydrogen Incorporation in Boron-Doped 6H—SiC CVD Epilayers Produced Using Site-Competition Epitaxy; Journal of Electronic Materials, vol. 24, No. 4, 1995.*
Larkin; SiC Dopant Incorporation Control Using Site-Competition CVD; Phys. Stat. Sol. (b) 202, 305; 1997.*
Kimoto et al., "Incorporation mechanism of N, Al, and B impurities in chemical vapor deposition of SiC", Applied Physics Letters, vol. 67, No. 16, Oct. 16, 1995, pp. 2385-2387; cited in the ISR.
International Search Report dated Nov. 27, 2012 issued in corresponding application No. PCT/JP2012/073413.
Office Action dated May 22, 2017, issued counterpart Korean patent application No. 10-2014-7035979 (w/ English translation; 14 pages).

* cited by examiner

*Primary Examiner* — Guinever S Gregorio
(74) *Attorney, Agent, or Firm* — Westerman, Hattori, Daniels & Adrian, LLP

(57) ABSTRACT

A CVD-SiC formed body has low light transmittance and high resistivity, and may suitably be used as a member for an etcher that is used for a semiconductor production process, for example. The SiC formed body is formed using a CVD method, and includes 1 to 30 mass ppm of boron atoms, and more than 100 mass ppm and 1000 mass ppm or less of nitrogen atoms. The SiC formed body preferably has a resistivity of more than 10 Ω·cm and 100,000 Ω·cm or less, and a light transmittance at a wavelength of 950 nm of 0 to 1%.

3 Claims, No Drawings

SIC FORMED BODY AND METHOD FOR PRODUCING SIC FORMED BODY

TECHNICAL FIELD

The invention relates to an SiC formed body, and a method for producing an SiC formed body.

BACKGROUND ART

An SiC formed body (CVD-SiC formed body) that is obtained by depositing SiC on the surface of a substrate using a chemical vapor deposition (CVD) method, and removing the substrate, has high density and high purity as compared with an SiC formed body produced using a sintering method, and exhibits excellent corrosion resistance, heat resistance, and strength. Therefore, it has been proposed to use the CVD-SiC formed body as a heater used for semiconductor production equipment, a dummy wafer, a susceptor, and a reactor core tube used for an etcher and a CVD device, and the like (see Patent Document 1 (JP-A-2006-16662), for example).

However, when using the CVD-SiC formed body as a heater for semiconductor production equipment, the CVD-SiC formed body is required to have a low resistivity almost equal to that of SiC produced using the sintering method in addition to the above properties. When using the CVD-SiC formed body as a dummy wafer, the CVD-SiC formed body is required to have low light transmittance. A CVD-SiC formed body having properties sufficient for use as a substrate used for semiconductor production has not been obtained.

In view of the above situation, the applicant of the present application proposed a CVD-SiC formed body that is obtained by feeding a feed gas in the presence of nitrogen gas, and has low resistivity and low light transmittance (see Patent Document 2 (JP-A-2002-47066)).

RELATED-ART DOCUMENT

Patent Document

Patent Document 1: JP-A-2006-16662
Patent Document 2: JP-A-2002-47066

SUMMARY OF THE INVENTION

Technical Problem

When applying the CVD-SiC formed body to a member for an etcher used for a semiconductor production process, the CVD-SiC formed body is required to have low light transmittance, and have a different resistivity, taking account of the usage conditions.

The CVD-SiC formed body disclosed in Patent Document 2 can suitably be used as a member for an etcher for which low light transmittance and low resistivity are required. However, a member for an etcher has been desired that is formed of a CVD-SiC formed body that has low light transmittance and high resistivity (e.g., 10 Ω·cm or more).

In view of the above situation, an object of the invention is to provide a CVD-SiC formed body that has low light transmittance and high resistivity, and may suitably be used as a member for an etcher that is used for a semiconductor production process, and a method that easily produces the SiC formed body using a CVD method.

Solution to Problem

The inventors of the invention conducted extensive studies, and found that the above technical problem can be solved by an SiC formed body that is formed using a CVD method, and includes 1 to 30 mass ppm of boron atoms, and more than 100 mass ppm and 1000 mass ppm or less of nitrogen atoms, and a method for producing the same. This finding has led to the completion of the invention.

Several aspects of the invention provide the following.

(1) An SiC formed body that is formed using a CVD method, the SiC formed body including 1 to 30 mass ppm of boron atoms, and more than 100 mass ppm and 1000 mass ppm or less of nitrogen atoms.

(2) The SiC formed body according to (1), having a resistivity of more than 10 Ω·cm and 100,000 Ω·cm or less, and a light transmittance at a wavelength of 950 nm of 0 to 1%.

(3) A method for producing an SiC formed body including introducing a feed gas, a boron compound gas, a nitrogen atom-containing compound gas, and a carrier gas into a reaction chamber to form an SiC film on a surface of a substrate using a CVD method, the volume ratio of the amount of the boron compound gas to the total amount of the boron compound gas, the nitrogen atom-containing compound gas, and the carrier gas, measured at a temperature of 20° C., being $5 \times 10^{-4}$ to 0.02 vol %, the volume ratio of the amount of the nitrogen atom-containing compound gas to the total amount of the boron compound gas, the nitrogen atom-containing compound gas, and the carrier gas, measured at a temperature of 20° C., being 0.05 to 3.0 vol %, the volume ratio of the amount of the carrier gas to the total amount of the boron compound gas, the nitrogen atom-containing compound gas, and the carrier gas, measured at a temperature of 20° C., being 96.9800 to 99.9495 vol %, the volume ratio of the amount of the feed gas to the total amount of the feed gas, the boron compound gas, the nitrogen atom-containing compound gas, and the carrier gas, measured at a temperature of 20° C., being 2 to 15 vol %, and the volume ratio of the total amount of the boron compound gas, the nitrogen atom-containing compound gas, and the carrier gas to the total amount of the feed gas, the boron compound gas, the nitrogen atom-containing compound gas, and the carrier gas, measured at a temperature of 20° C., being 85 to 98 vol %.

Advantageous Effects of the Invention

The aspects of the invention thus provide a CVD-SiC formed body that has low light transmittance and high resistivity, and may suitably be used as a member for an etcher that is used for a semiconductor production process, for example, and a method that easily produces the SiC formed body using a CVD method.

DESCRIPTION OF EMBODIMENTS

An SiC formed body according to one embodiment of the invention is described below.

The SiC formed body according to one embodiment of the invention is formed using a CVD method, and includes 1 to 30 mass ppm of boron atoms, and more than 100 mass ppm and 1000 mass ppm or less of nitrogen atoms.

The SiC formed body according to one embodiment of the invention includes 1 to 30 mass ppm ($1.8 \times 10^{17}$ atoms/cm$^3$ to $5.4 \times 10^{18}$ atoms/cm$^3$) of boron atoms. The SiC formed body according to one embodiment of the invention preferably includes 1 to 20 mass ppm of boron atoms, and more preferably includes 1 to 10 mass ppm of boron atoms.

When the content of boron atoms in the SiC formed body according to one embodiment of the invention is within the above range, it is possible to suppress a decrease in resistivity due to nitrogen atoms, and suppress a situation in which boron atoms are mixed into a semiconductor wafer as impurities when the SiC formed body is used as a member for semiconductor production equipment.

Note that the content of boron atoms in the SiC formed body refers to a value measured using a glow discharge mass spectrometer (GD-MS) ("VG-9000" manufactured by FI Elemental).

More specifically, a glow discharge is produced in an Ar gas atmosphere using the sample as a cathode, and the constituent elements of the sputtered surface of the sample are ionized in the discharge plasma. The ionized constituent elements are analyzed using the mass spectrometer, and the ionic strength ratio of the main component elements to the target elements (boron atoms) is corrected using a relative sensitivity factor (RSF) to calculate the content of the target elements (boron atoms).

The SiC formed body according to one embodiment of the invention includes more than 100 mass ppm and 1000 mass ppm or less (more than $1.37 \times 10^{19}$ atoms/cm$^3$ and $1.37 \times 10^{20}$ atoms/cm$^3$ or less) of nitrogen atoms. The SiC formed body according to one embodiment of the invention preferably includes 100 to 600 mass ppm of nitrogen atoms, and more preferably includes 100 to 300 mass ppm of nitrogen atoms.

When the content of nitrogen atoms in the SiC formed body according to one embodiment of the invention is within the above range, the light transmittance of the SiC formed body can be advantageously reduced.

Note that the content of nitrogen atoms in the SiC formed body refers to a value measured using a secondary ion mass spectrometer (SIMS) (e.g., "SIMS-4000" manufactured by ATOMIKA).

More specifically, the constituent atoms of the sample that are released into a vacuum as secondary ions by applying ions (Cs$^+$ or O$_2^+$) to the solid surface are mass-separated and detected using the mass spectrometer to determine the concentration of nitrogen atoms in the SiC formed body.

The atomic ratio (boron atoms/nitrogen atoms) of boron atoms to nitrogen atoms included in the SiC formed body according to one embodiment of the invention is preferably 0.01 to 2, more preferably 0.01 to 1, and still more preferably 0.01 to 0.5.

When the atomic ratio of boron atoms to nitrogen atoms included in the SiC formed body according to one embodiment of the invention is within the above range, it is possible to easily provide an SiC formed body that has low light transmittance and high resistivity.

The amount of boron atoms and the amount of nitrogen atoms included in the SiC formed body according to one embodiment of the invention may be controlled by adjusting the amount of boron atom compound and the amount of nitrogen atom-containing compound introduced when producing the SiC formed body according to one embodiment of the invention.

The SiC formed body according to one embodiment of the invention has an SiC content of 99.900 to 99.988 mass %. It is preferable that the SiC formed body according to one embodiment of the invention include only SiC in addition to boron atoms and nitrogen atoms.

Note that the SiC content in the SiC formed body refers to a value obtained by subtracting the content (mass %) of nitrogen atoms measured using the secondary ion mass spectrometer (SIMS), the content (mass %) of boron atoms measured using the glow discharge mass spectrometer (GD-MS), and the content (mass %) of metal elements that adversely affect semiconductor production, from 100 mass %.

SiC included in the SiC formed body according to one embodiment of the invention normally has a polycrystalline morphology. For example, SiC included in the SiC formed body according to one embodiment of the invention may include polytypes (e.g., 3C, 2H, 4H, and 15R) of an alpha-SiC crystal.

The content ratio of each polytype may be calculated from the integrated intensity ratio of the main peak determined by powder X-ray diffractometry.

It is considered that the SiC formed body according to one embodiment of the invention has a structure in which some of the carbon atoms (C) included in the SiC crystals are substituted with a nitrogen atom (N) (i.e., n-type dopant). The number of free electrons increases, and the resistivity of the SiC formed body decreases as a result of substitution of the carbon atoms (C) included in SiC with a nitrogen atom (N).

It is considered that the SiC formed body according to one embodiment of the invention has a structure in which some of the carbon atoms (C) included in the SiC crystals are substituted with a boron atom (B) (i.e., p-type dopant). The number of electron holes increases, and the resistivity of the SiC formed body decreases as a result of substitution of the carbon atoms (C) included in SiC with a boron atom (B).

Specifically, both nitrogen atoms and boron atoms reduce the resistivity of the SiC formed body. However, the inventors found that a decrease in resistivity due to nitrogen atoms can be suppressed by boron atoms, and an SiC formed body having high resistivity can be obtained by causing electron holes due to boron atoms to compensate for free electrons due to nitrogen atoms.

Therefore, the resistivity of the SiC formed body according to one embodiment of the invention can be easily controlled by controlling the amount (number) of boron atoms (i.e., the number of electron holes) and the amount (number) of nitrogen atoms (i.e., the number of free electrons).

The inventors also found that the light transmittance of the SiC formed body according to one embodiment of the invention can be easily reduced when the SiC formed body includes specific amounts of boron atoms and nitrogen atoms. Therefore, the light transmittance of the SiC formed body according to one embodiment of the invention can be easily controlled by controlling the amount of boron atoms and the amount of nitrogen atoms.

The SiC formed body according to one embodiment of the invention preferably has a resistivity of more than 10 Ω·cm and 100,000 Ω·cm or less, more preferably 11 to 100,000 Ω·cm, and still more preferably 11 to 20,000 Ω·cm.

Note that the resistivity of the SiC formed body refers to a value calculated from the electrical resistance of a test piece (4 mm×40 mm×0.5 mm (thickness)) prepared from the SiC formed body, measured using a four-terminal voltage drop method at a terminal-to-terminal distance of 20 mm.

The SiC formed body according to one embodiment of the invention preferably has a light transmittance at a wavelength of 950 nm of 0 to 1%, more preferably 0 to 0.5%, and still more preferably 0 to 0.1%.

Note that the light transmittance of the SiC formed body at a wavelength of 950 nm refers to a value determined by measuring the intensity (amount) of red LED light (emitted from a photoelectric sensor head) that has passed through the SiC formed body, and reached a light-receiving section.

The SiC formed body according to one embodiment of the invention may suitably be used as a member for an etcher that is used for a semiconductor production process, for example.

The SiC formed body according to one embodiment of the invention is formed using a CVD method. A method for producing the SiC formed body according to one embodiment of the invention using a CVD method is described in detail below.

The embodiments of the invention thus provide a CVD-SiC formed body that has low light transmittance and high resistivity.

A method for producing an SiC formed body according to one embodiment of the invention is described below.

The method for producing an SiC formed body (hereinafter may be referred to as "production method") according to one embodiment of the invention includes introducing a feed gas, a boron compound gas, a nitrogen atom-containing compound gas, and a carrier gas into a reaction chamber to form an SiC film on a surface of a substrate using a CVD method, the volume ratio of the amount of the boron compound gas to the total amount of the boron compound gas, the nitrogen atom-containing compound gas, and the carrier gas, measured at a temperature of 20° C., being $5 \times 10^{-4}$ to 0.02 vol %, the volume ratio of the amount of the nitrogen atom-containing compound gas to the total amount of the boron compound gas, the nitrogen atom-containing compound gas, and the carrier gas, measured at a temperature of 20° C., being 0.05 to 3.0 vol %, the volume ratio of the amount of the carrier gas to the total amount of the boron compound gas, the nitrogen atom-containing compound gas, and the carrier gas, measured at a temperature of 20° C., being 96.9800 to 99.9495 vol %, the volume ratio of the amount of the feed gas to the total amount of the feed gas, the boron compound gas, the nitrogen atom-containing compound gas, and the carrier gas, measured at a temperature of 20° C., being 2 to 15 vol %, and the volume ratio of the total amount of the boron compound gas, the nitrogen atom-containing compound gas, and the carrier gas to the total amount of the feed gas, the boron compound gas, the nitrogen atom-containing compound gas, and the carrier gas, measured at a temperature of 20° C., being 85 to 98 vol %.

The production method according to one embodiment of the invention may utilize an arbitrary device that includes a reaction chamber in which a CVD reaction is effected. For example, the production method according to one embodiment of the invention may utilize a reaction vessel that includes a high-frequency coil that is provided inside or outside the reaction vessel, and heats the inside of the reaction chamber, a gas introduction tube that introduces the feed gas, the boron compound gas, the nitrogen atom-containing compound gas, and the carrier gas into the reaction chamber, and an outlet for discharging gas from the reaction chamber.

The feed gas used for the production method according to one embodiment of the invention refers to gas (SiC crystal-forming gas) that can produce an SiC crystal through a reaction. The feed gas may be a unitary feed gas that includes one or more gases selected from $CH_3SiCl_3$ gas, $(CH_3)_2SiCl_2$ gas, $(CH_3)_3SiCl$ gas, and the like, or may be a binary feed gas that includes one or more silicon source compounds selected from $SiCl_4$ gas, $SiHCl_3$ gas, $SiCl_2H_2$ gas, $SiH_4$ gas, and the like, and one or more carbon source compounds selected from $CH_4$ gas, $C_2H_6$ gas, $C_3H_8$ gas, and the like.

The boron compound gas used for the production method according to one embodiment of the invention may be one or more gases selected from $BF_3$ gas, $BCl_3$ gas, $BBr_3$ gas, $B_2O_3$ gas, and the like.

The nitrogen atom-containing compound gas used for the production method according to one embodiment of the invention may be one or more gases selected from $N_2$ gas, $NH_3$ gas, and the like.

When using $N_2$ gas as the nitrogen atom-containing compound gas, it is preferable to use $N_2$ gas that has a purity of 99.99 mass % or more and an oxygen content of 5 mass ppm or less.

The carrier gas used for the production method according to one embodiment of the invention is not particularly limited as long as the carrier gas is normally used for a CVD method.

When implementing the production method according to one embodiment of the invention, the volume ratio of the introduction amount of the boron compound gas to the total amount of the boron compound gas, the nitrogen atom-containing compound gas, and the carrier gas, measured at a temperature of 20° C., is $5 \times 10^{-4}$ to 0.02 vol %, preferably $5 \times 10^{-4}$ to 0.005 vol %, and more preferably $5 \times 10^{-4}$ to 0.0025 vol %.

When implementing the production method according to one embodiment of the invention, the volume ratio of the introduction amount of the nitrogen atom-containing compound gas to the total amount of the boron compound gas, the nitrogen atom-containing compound gas, and the carrier gas, measured at a temperature of 20° C., is 0.05 to 3.0 vol %, preferably 0.05 to 1.0 vol %, and more preferably 0.05 to 0.1 vol %.

When implementing the production method according to one embodiment of the invention, the volume ratio of the introduction amount of the carrier gas to the total amount of the boron compound gas, the nitrogen atom-containing compound gas, and the carrier gas, measured at a temperature of 20° C., is 96.9800 to 99.9495 vol %, preferably 99.0000 to 99.9495 vol %, and more preferably 99.9000 to 99.9495 vol %.

When the boron compound gas, the nitrogen atom-containing compound gas, and the carrier gas are introduced in a ratio within the above ranges when implementing the production method according to one embodiment of the invention, the boron compound gas and the nitrogen atom-containing compound gas are sufficiently introduced into the reaction chamber, and an SiC formed body that includes the desired amounts of boron atoms and nitrogen atoms, and has low light transmittance and high resistivity can be efficiently produced.

When implementing the production method according to one embodiment of the invention, the volume ratio of the introduction amount of the feed gas to the total amount of the feed gas, the boron compound gas, the nitrogen atom-containing compound gas, and the carrier gas, measured at a temperature of 20° C., is 2 to 15 vol %, preferably 2 to 10 vol %, and more preferably 5 to 10 vol %.

When implementing the production method according to one embodiment of the invention, the volume ratio of the total introduction amount of the boron compound gas, the nitrogen atom-containing compound gas, and the carrier gas to the total amount of the feed gas, the boron compound gas, the nitrogen atom-containing compound gas, and the carrier gas, measured at a temperature of 20° C., is 85 to 98 vol %, preferably 90 to 98 vol %, and more preferably 90 to 95 vol %.

When the content ratio of the feed gas and the total content ratio of the boron compound gas, the nitrogen atom-containing compound gas, and the carrier gas are within the above ranges when implementing the production method according to one embodiment of the invention, the SiC formed body can be formed at a preferable deposition rate, and an SiC formed body having a stoichiometric composition can be easily obtained instead of an Si-rich SiC formed body.

The production method according to one embodiment of the invention introduces the feed gas, the boron compound gas, the nitrogen atom-containing compound gas, and the carrier gas into the reaction chamber to form an SiC film on the surface of the substrate using a CVD method.

When implementing the production method according to one embodiment of the invention, the boron compound gas, the nitrogen atom-containing compound gas, and the carrier gas may be independently introduced into the reaction chamber, or may be introduced into the reaction chamber in a state in which two or more gases are mixed. It is preferable to introduce the boron compound gas, the nitrogen atom-containing compound gas, and the carrier gas into the reaction chamber in a state in which the boron compound gas, the nitrogen atom-containing compound gas, and the carrier gas are mixed (i.e., mixed gas).

A graphite material is preferable as the substrate on which the SiC film is formed by the production method according to one embodiment of the invention.

It is preferable that the substrate have an impurity content of 20 mass ppm or less, a coefficient of thermal expansion of $3.0 \times 10^{-6}/°C$ to $4.5 \times 10^{-6}/°C$, and a bulk specific gravity of 1.75 to 1.85.

The substrate has a shape corresponding to the shape of the desired SiC formed body. For example, when producing an SiC formed body having a disc-like shape, a substrate having a disc-like shape is used as the substrate.

When implementing the production method according to one embodiment of the invention, the feed gas and the carrier gas may be introduced into the reaction chamber by bubbling the carrier gas (into which the boron compound gas and the nitrogen atom-containing compound gas are mixed in a given ratio) through a feed liquid contained in a feed tank to produce a mixed gas of the feed gas, the boron compound gas, the nitrogen atom-containing compound gas, and the carrier gas, introducing the mixed gas into a mixer to sufficiently mix the mixed gas, and introducing the mixed gas into the reaction chamber through the gas introduction tube to deposit an SiC film on the surface of the substrate (that is placed in the reaction chamber and heated to a given temperature) using a CVD method.

When implementing the production method according to one embodiment of the invention, the feed gas reaction temperature is preferably 1050 to 1700° C., more preferably 1150 to 1600° C., and still more preferably 1200 to 1500° C.

When the feed gas reaction temperature is within the above range when implementing the production method according to one embodiment of the invention, it is possible to easily obtain an SiC formed body having controlled resistivity.

If the reaction temperature is less than 1050° C., free Si may be easily formed at the same time as SiC crystals. If the reaction temperature exceeds 1700° C., the corrosion resistance, the heat resistance, and the durability of the reactor may be adversely affected, and the degree of freedom relating to the selection of the material may decrease. Moreover, it may become necessary to perform frequent maintenance.

The reaction temperature may be controlled by adjusting the substrate temperature when depositing the feed gas onto the substrate, for example.

When implementing the production method according to one embodiment of the invention, it is preferable that the deposition rate of the SiC film formed on the substrate be 20 to 100 μm/hr. The deposition rate may be controlled by adjusting the feed rate of the feed gas, the boron compound gas, the nitrogen atom-containing compound gas, and the carrier gas to the reaction chamber (i.e., the residence time of the feed gas, the boron compound gas, the nitrogen atom-containing compound gas, and the carrier gas in the reaction chamber), and the substrate temperature (reaction temperature).

The production method according to one embodiment of the invention may include removing unnecessary SiC film by machining or grinding after depositing the SiC film.

When implementing the production method according to one embodiment of the invention, the substrate graphite may be appropriately removed by air oxidation, machining, grinding, or the like after depositing the SiC film to obtain an SiC formed body having the desired shape.

The resulting SiC formed body may optionally be processed to have a shape and surface properties appropriate for the desired application.

When implementing the production method according to one embodiment of the invention, some of the carbon atoms (C) included in the SiC crystals are substituted with a nitrogen atom (N) (i.e., n-type dopant), and the resistivity of the resulting SiC formed body is reduced by introducing gas (nitrogen atom-containing compound gas) that includes a nitrogen atom (i.e., n-type dopant) together with the feed gas when forming the SiC formed body using a CVD method.

Some of the carbon atoms (C) included in the SiC crystals are substituted with a boron atom (B) (i.e., p-type dopant), and the resistivity of the SiC formed body is reduced by introducing gas (boron compound gas) that includes a boron atom (i.e., p-type dopant) together with the feed gas when forming the SiC formed body using a CVD method.

Both nitrogen atoms and boron atoms reduce the resistivity of the SiC formed body. However, the inventors found that a decrease in resistivity due to nitrogen atoms can be suppressed by boron atoms by causing electron holes due to boron atoms to compensate for free electrons due to nitrogen atoms. Therefore, an SiC formed body having controlled resistivity can be easily produced by controlling the amounts of the boron compound gas and the nitrogen atom-containing compound gas supplied to the reaction chamber.

The inventors also found that the light transmittance of the SiC formed body obtained by the production method according to one embodiment of the invention can be easily reduced when the SiC formed body includes specific amounts of boron atoms and nitrogen atoms. Therefore, an SiC formed body having controlled light transmittance can be easily produced by controlling the introduction amounts of the boron compound gas and the nitrogen atom-containing compound gas.

The details of an SiC formed body produced using the production method according to one embodiment of the invention are the same as those described above in connection with the SiC formed body according to one embodiment of the invention.

The embodiments of the invention can thus provide a method that easily produces an SiC formed body that has low light transmittance and high resistivity, and may suitably be used as a member for an etcher that is used for a semiconductor production process, for example, using a CVD method.

EXAMPLES

The invention is further described below by way of examples. Note that the invention is not limited to the following examples.

Example 1

(1) A reaction vessel in which a 200 L reaction chamber was provided was used, the reaction vessel being provided with a high-frequency coil that is provided outside the reaction vessel, and heats the inside of the reaction chamber, a gas introduction tube that introduces a feed gas into the reaction chamber, a mixed gas introduction tube that introduces a mixed gas of a boron compound gas, a nitrogen atom-containing compound gas, and a carrier gas into the reaction chamber, and an outlet for discharging gas from the reaction chamber. A disc-like graphite substrate (impurity content: 16 mass ppm, coefficient of thermal expansion: $4.2 \times 10^{-6}/°$ C., bulk specific gravity: 1.79) having a diameter of 200 mm and a thickness of 5 mm was placed in the reaction chamber.
(2) $CH_3SiCl_3$ gas (feed gas) was introduced into the reaction chamber through the feed gas introduction tube, and a mixed gas of $BCl_3$ gas (boron compound gas), $N_2$ gas (nitrogen atom-containing compound gas), and $H_2$ gas (carrier gas) was introduced into the reaction chamber through the mixed gas introduction tube.

The mixed gas was prepared by mixing the $BCl_3$ gas, the $N_2$ gas, and the $H_2$ gas so that the volume ratio of the amount of the $BCl_3$ gas to the total amount of the $BCl_3$ gas, the $N_2$ gas, and the $H_2$ gas, measured at a temperature of 20° C., was 0.0025 vol %, the volume ratio of the amount of the $N_2$ gas to the total amount of the $BCl_3$ gas, the $N_2$ gas, and the $H_2$ gas, measured at a temperature of 20° C., was 0.05 vol %, and the volume ratio of the amount of the $H_2$ gas to the total amount of the $BCl_3$ gas, the $N_2$ gas, and the $H_2$ gas, measured at a temperature of 20° C., was 99.9475 vol %.

The feed gas and the mixed gas were simultaneously introduced so that the volume ratio of the introduction amount of the feed gas ($CH_3SiCl_3$ gas) to the total amount of the $CH_3SiCl_3$ gas, the $BCl_3$ gas, the $N_2$ gas, and the $H_2$ gas, measured at a temperature of 20° C., was 10 vol %, and the volume ratio of the introduction amount of the mixed gas to the total amount of the $CH_3SiCl_3$ gas, the $BCl_3$ gas, the $N_2$ gas, and the $H_2$ gas, measured at a temperature of 20° C., was 90 vol %.

Table 1 shows the mixing ratio of each gas.

The feed gas was reacted until a disc-like SiC formed body having a thickness of 2 mm was formed on the graphite substrate in a state in which the temperature inside the reaction chamber was controlled at 1400° C.

The graphite substrate was then removed by grinding, and the SiC formed body was subjected to surface grinding to obtain a disc-like SiC formed body having a thickness of 1 mm.

The resulting SiC formed body included 5.2 mass ppm of boron atoms and 125 mass ppm of nitrogen atoms, and had a resistivity of 85,000 Ω·cm and a light transmittance at a wavelength of 950 nm of 0.6%. Table 2 shows the properties of the SiC formed body.

Example 2

A disc-like SiC formed body having a thickness of 1 mm was obtained in the same manner as in Example 1, except that the mixed gas was prepared by mixing the $BCl_3$ gas, the $N_2$ gas, and the $H_2$ gas so that the volume ratio of the amount of the $BCl_3$ gas to the total amount of the $BCl_3$ gas, the $N_2$ gas, and the $H_2$ gas, measured at a temperature of 20° C., was 0.0006 vol %, the volume ratio of the amount of the $N_2$ gas to the total amount of the $BCl_3$ gas, the $N_2$ gas, and the $H_2$ gas, measured at a temperature of 20° C., was 0.05 vol %, and the volume ratio of the amount of the $H_2$ gas to the total amount of the $BCl_3$ gas, the $N_2$ gas, and the $H_2$ gas, measured at a temperature of 20° C., was 99.9494 vol %, and the feed gas and the mixed gas were simultaneously introduced so that the volume ratio of the introduction amount of the feed gas ($CH_3SiCl_3$ gas) to the total amount of the $CH_3SiCl_3$ gas, the $BCl_3$ gas, the $N_2$ gas, and the $H_2$ gas, measured at a temperature of 20° C., was 2.5 vol %, and the volume ratio of the introduction amount of the mixed gas to the total amount of the $CH_3SiCl_3$ gas, the $BCl_3$ gas, the $N_2$ gas, and the $H_2$ gas, measured at a temperature of 20° C., was 97.5 vol %. Table 1 shows the mixing ratio of each gas.

The resulting SiC formed body included 1.5 mass ppm of boron atoms and 120 mass ppm of nitrogen atoms, and had a resistivity of 1500 Ω·cm and a light transmittance at a wavelength of 950 nm of 0.8%. Table 2 shows the properties of the SiC formed body.

Example 3

A disc-like SiC formed body having a thickness of 1 mm was obtained in the same manner as in Example 1, except that the mixed gas was prepared by mixing the $BCl_3$ gas, the $N_2$ gas, and the $H_2$ gas so that the volume ratio of the amount of the $BCl_3$ gas to the total amount of the $BCl_3$ gas, the $N_2$ gas, and the $H_2$ gas, measured at a temperature of 20° C., was 0.005 vol %, the volume ratio of the amount of the $N_2$ gas to the total amount of the $BCl_3$ gas, the $N_2$ gas, and the $H_2$ gas, measured at a temperature of 20° C., was 0.1 vol %, and the volume ratio of the amount of the $H_2$ gas to the total amount of the $BCl_3$ gas, the $N_2$ gas, and the $H_2$ gas, measured at a temperature of 20° C., was 99.8950 vol %, and the feed gas and the mixed gas were simultaneously introduced so that the volume ratio of the introduction amount of the feed gas ($CH_3SiCl_3$ gas) to the total amount of the $CH_3SiCl_3$ gas, the $BCl_3$ gas, the $N_2$ gas, and the $H_2$ gas, measured at a temperature of 20° C., was 12 vol %, and the volume ratio of the introduction amount of the mixed gas to the total amount of the $CH_3SiCl_3$ gas, the $BCl_3$ gas, the $N_2$ gas, and the $H_2$ gas, measured at a temperature of 20° C., was 88 vol %. Table 1 shows the mixing ratio of each gas.

The resulting SiC formed body included 9.6 mass ppm of boron atoms and 240 mass ppm of nitrogen atoms, and had a resistivity of 16,000 Ω·cm and a light transmittance at a wavelength of 950 nm of 0.3%. Table 2 shows the properties of the SiC formed body.

Example 4

A disc-like SiC formed body having a thickness of 1 mm was obtained in the same manner as in Example 1, except that the mixed gas was prepared by mixing the $BCl_3$ gas, the $N_2$ gas, and the $H_2$ gas so that the volume ratio of the amount of the $BCl_3$ gas to the total amount of the $BCl_3$ gas, the $N_2$ gas, and the $H_2$ gas, measured at a temperature of 20° C., was 0.02 vol %, the volume ratio of the amount of the $N_2$ gas to the total amount of the $BCl_3$ gas, the $N_2$ gas, and the $H_2$ gas, measured at a temperature of 20° C., was 3 vol %, and the volume ratio of the amount of the $H_2$ gas to the total amount of the $BCl_3$ gas, the $N_2$ gas, and the $H_2$ gas, measured at a temperature of 20° C., was 96.9800 vol %, and the feed gas and the mixed gas were simultaneously introduced so that the volume ratio of the introduction amount of the feed gas ($CH_3SiCl_3$ gas) to the total amount of the $CH_3SiCl_3$ gas, the $BCl_3$ gas, the $N_2$ gas, and the $H_2$ gas, measured at a temperature of 20° C., was 10 vol %, and the volume ratio of the introduction amount of the mixed gas to the total amount of the $CH_3SiCl_3$ gas, the $BCl_3$ gas, the $N_2$ gas, and the $H_2$ gas, measured at a temperature of 20° C., was 90 vol %. Table 1 shows the mixing ratio of each gas.

The resulting SiC formed body included 29 mass ppm of boron atoms and 940 mass ppm of nitrogen atoms, and had a resistivity of 13 $\Omega \cdot cm$ and a light transmittance at a wavelength of 950 nm of 0.05%. Table 2 shows the properties of the SiC formed body.

Example 5

A disc-like SiC formed body having a thickness of 1 mm was obtained in the same manner as in Example 1, except that the mixed gas was prepared by mixing the $BCl_3$ gas, the $N_2$ gas, and the $H_2$ gas so that the volume ratio of the amount of the $BCl_3$ gas to the total amount of the $BCl_3$ gas, the $N_2$ gas, and the $H_2$ gas, measured at a temperature of 20° C., was 0.005 vol %, the volume ratio of the amount of the $N_2$ gas to the total amount of the $BCl_3$ gas, the $N_2$ gas, and the $H_2$ gas, measured at a temperature of 20° C., was 1 vol %, and the volume ratio of the amount of the $H_2$ gas to the total amount of the $BCl_3$ gas, the $N_2$ gas, and the $H_2$ gas, measured at a temperature of 20° C., was 98.9950 vol %, and the feed gas and the mixed gas were simultaneously introduced so that the volume ratio of the introduction amount of the feed gas ($CH_3SiCl_3$ gas) to the total amount of the $CH_3SiCl_3$ gas, the $BCl_3$ gas, the $N_2$ gas, and the $H_2$ gas, measured at a temperature of 20° C., was 12 vol %, and the volume ratio of the introduction amount of the mixed gas to the total amount of the $CH_3SiCl_3$ gas, the $BCl_3$ gas, the $N_2$ gas, and the $H_2$ gas, measured at a temperature of 20° C., was 88 vol %. Table 1 shows the mixing ratio of each gas.

The resulting SiC formed body included 9.8 mass ppm of boron atoms and 580 mass ppm of nitrogen atoms, and had a resistivity of 690 $\Omega \cdot cm$ and a light transmittance at a wavelength of 950 nm of 0.1%. Table 2 shows the properties of the SiC formed body.

Comparative Example 1

A disc-like SiC formed body having a thickness of 1 mm was obtained in the same manner as in Example 1, except that the mixed gas was prepared by mixing the $BCl_3$ gas, the $N_2$ gas, and the $H_2$ gas so that the volume ratio of the amount of the $BCl_3$ gas to the total amount of the $BCl_3$ gas, the $N_2$ gas, and the $H_2$ gas, measured at a temperature of 20° C., was 0.1 vol %, the volume ratio of the amount of the $N_2$ gas to the total amount of the $BCl_3$ gas, the $N_2$ gas, and the $H_2$ gas, measured at a temperature of 20° C., was 0.005 vol %, and the volume ratio of the amount of the $H_2$ gas to the total amount of the $BCl_3$ gas, the $N_2$ gas, and the $H_2$ gas, measured at a temperature of 20° C., was 99.8950 vol %, and the feed gas and the mixed gas were simultaneously introduced so that the volume ratio of the introduction amount of the feed gas ($CH_3SiCl_3$ gas) to the total amount of the $CH_3SiCl_3$ gas, the $BCl_3$ gas, the $N_2$ gas, and the $H_2$ gas, measured at a temperature of 20° C., was 1.5 vol %, and the volume ratio of the introduction amount of the mixed gas to the total amount of the $CH_3SiCl_3$ gas, the $BCl_3$ gas, the $N_2$ gas, and the $H_2$ gas, measured at a temperature of 20° C., was 98.5 vol %. Table 1 shows the mixing ratio of each gas.

The resulting SiC formed body included 54 mass ppm of boron atoms and 10 mass ppm of nitrogen atoms, and had a resistivity of 6.5 $\Omega \cdot cm$ and a light transmittance at a wavelength of 950 nm of 2.8%. Table 2 shows the properties of the SiC formed body.

Comparative Example 2

A disc-like SiC formed body having a thickness of 1 mm was obtained in the same manner as in Example 1, except that the mixed gas was prepared by mixing the $BCl_3$ gas, the $N_2$ gas, and the $H_2$ gas so that the volume ratio of the amount of the $BCl_3$ gas to the total amount of the $BCl_3$ gas, the $N_2$ gas, and the $H_2$ gas, measured at a temperature of 20° C., was 0.0025 vol %, the volume ratio of the amount of the $N_2$ gas to the total amount of the $BCl_3$ gas, the $N_2$ gas, and the $H_2$ gas, measured at a temperature of 20° C., was 5 vol %, and the volume ratio of the amount of the $H_2$ gas to the total amount of the $BCl_3$ gas, the $N_2$ gas, and the $H_2$ gas, measured at a temperature of 20° C., was 94.9975 vol %, and the feed gas and the mixed gas were simultaneously introduced so that the volume ratio of the introduction amount of the feed gas ($CH_3SiCl_3$ gas) to the total amount of the $CH_3SiCl_3$ gas, the $BCl_3$ gas, the $N_2$ gas, and the $H_2$ gas, measured at a temperature of 20° C., was 18 vol %, and the volume ratio of the introduction amount of the mixed gas to the total amount of the $CH_3SiCl_3$ gas, the $BCl_3$ gas, the $N_2$ gas, and the $H_2$ gas, measured at a temperature of 20° C., was 82 vol %. Table 1 shows the mixing ratio of each gas.

The resulting SiC formed body included 5.3 mass ppm of boron atoms and 1800 mass ppm of nitrogen atoms, and had a resistivity of 0.17 $\Omega \cdot cm$ and a light transmittance at a wavelength of 950 nm of 0.05%. Table 2 shows the properties of the SiC formed body.

TABLE 1

| | Mixing ratio (vol %) of feed gas to mixed gas | | Composition (vol %) of mixed gas | | |
|---|---|---|---|---|---|
| | Feed gas | Mixed gas | $BCl_3$ gas | $N_2$ gas | $H_2$ gas |
| Example 1 | 10 | 90 | 0.0025 | 0.05 | 99.9475 |
| Example 2 | 2.5 | 97.5 | 0.0006 | 0.05 | 99.9494 |
| Example 3 | 12 | 88 | 0.005 | 0.1 | 99.8950 |
| Example 4 | 10 | 90 | 0.02 | 3 | 96.9800 |
| Example 5 | 12 | 88 | 0.005 | 1 | 98.9950 |
| Comparative Example 1 | 1.5 | 98.5 | 0.1 | 0.005 | 99.8950 |
| Comparative Example 2 | 18 | 82 | 0.0025 | 5 | 94.9975 |

TABLE 2

| | Boron atom content (mass ppm) | Nitrogen atom content (mass ppm) | Resistivity ($\Omega \cdot cm$) | Transmittance (%) at wavelength of 950 nm |
|---|---|---|---|---|
| Example 1 | 5.2 | 125 | 85,000 | 0.6 |
| Example 2 | 1.5 | 120 | 1500 | 0.8 |
| Example 3 | 9.6 | 240 | 16,000 | 0.3 |
| Example 4 | 29 | 940 | 13 | 0.05 |

TABLE 2-continued

|  | Boron atom content (mass ppm) | Nitrogen atom content (mass ppm) | Resistivity (Ω · cm) | Transmittance (%) at wavelength of 950 nm |
|---|---|---|---|---|
| Example 5 | 9.8 | 580 | 690 | 0.1 |
| Comparative Example 1 | 54 | 10 | 6.5 | 2.8 |
| Comparative Example 2 | 5.3 | 1800 | 0.17 | 0.05 |

As is clear from the results shown in Table 2, an SiC formed body having a resistivity as high as 13 to 85,000 Ω·cm and a light transmittance (at a wavelength of 950 nm) as low as 0.05 to 0.8%, could be easily produced in Examples 1 to 5 by incorporating 1.5 to 29 mass ppm of boron atoms and 120 to 940 mass ppm of nitrogen atoms in the SiC formed body.

As is clear from the comparison between the SiC formed bodies obtained in Examples 1 to 5 with the SiC formed body obtained in Comparative Example 1 (see Table 2), it was confirmed that the light transmittance at a wavelength of 950 nm can be controlled to 0 to 1% by adjusting the concentration of nitrogen atoms to more than 100 mass ppm and 1000 mass ppm or less.

The SiC formed body obtained in Example 1 and the SiC formed body obtained in Example 2 had an almost identical nitrogen atom concentration (see Table 2). It was thus confirmed that the resistivity of the SiC formed body increases as the boron atom concentration increases when the nitrogen atom concentration is almost identical.

It was thus confirmed that the resistivity and the light transmittance of the resulting SiC formed body can be controlled by controlling the amount of nitrogen atoms and the amount of boron atoms introduced into the SiC formed body.

In Comparative Examples 1 and 2, only an SiC formed body having a resistivity as low as 0.17 to 6.5 Ω·cm (Comparative Examples 1 and 2), and/or a light transmittance (at a wavelength of 950 nm) as high as 2.8% (Comparative Example 1) could be obtained since the content of boron atoms was too high (54 mass ppm) (Comparative Example 1), or the content of nitrogen atoms was too high (1800 mass ppm) (Comparative Example 2).

INDUSTRIAL APPLICABILITY

The embodiments of the invention can thus provide a CVD-SiC formed body that has low light transmittance and high resistivity, and may suitably be used as a member for an etcher that is used for a semiconductor production process, for example, and a method that easily produces the SiC formed body using a CVD method.

The invention claimed is:

1. An SiC formed body that is formed by a chemical vapor deposition (CVD) method, the SiC formed body comprising 9.6 to 30 mass ppm of boron atoms, and more than 100 mass ppm and 1000 mass ppm or less of nitrogen atoms,
    wherein the SiC formed body has a resistivity of 10,000 Ω·cm or more to 100,000 Ω·cm or less.

2. The SiC formed body according to claim 1, having a light transmittance at a wavelength of 950 nm of 0 to 1%.

3. The SiC formed body according to claim 1 produced by a method comprising introducing a feed gas, a boron compound gas, a nitrogen atom-containing compound gas, and a carrier gas into a reaction chamber to form an SiC film on a surface of a substrate using a chemical vapor deposition (CVD) method,
    the volume ratio of the amount of the boron compound gas to the total amount of the boron compound gas, the nitrogen atom-containing compound gas, and the carrier gas, measured at a temperature of 20° C., being $5 \times 10^{-4}$ to 0.02 vol %, the volume ratio of the amount of the nitrogen atom-containing compound gas to the total amount of the boron compound gas, the nitrogen atom-containing compound gas, and the carrier gas, measured at a temperature of 20° C., being 0.05 to 3.0 vol %, the volume ratio of the amount of the carrier gas to the total amount of the boron compound gas, the nitrogen atom-containing compound gas, and the carrier gas, measured at a temperature of 20° C., being 96.9800 to 99.9495 vol %,
    the volume ratio of the amount of the feed gas to the total amount of the feed gas, the boron compound gas, the nitrogen atom-containing compound gas, and the carrier gas, measured at a temperature of 20° C., being 2 to 15 vol %, and the volume ratio of the total amount of the boron compound gas, the nitrogen atom-containing compound gas,
    and the carrier gas to the total amount of the feed gas, the boron compound gas, the nitrogen atom-containing compound gas, and the carrier gas, measured at a temperature of 20° C., being 85 to 98 vol %.

* * * * *